United States Patent
Fisher et al.

(10) Patent No.: US 7,149,142 B1
(45) Date of Patent: Dec. 12, 2006

(54) METHODS AND APPARATUSES FOR MEMORY ARRAY LEAKAGE REDUCTION USING INTERNAL VOLTAGE BIASING CIRCUITRY

(75) Inventors: Louis Cameron Fisher, Bainbridge Island, WA (US); Charles Jeremy Brumitt, Seattle, WA (US)

(73) Assignee: Virage Logic Corporation, Fremont, CA (US)

( * ) Notice: Subject to any disclaimer, the term of this patent is extended or adjusted under 35 U.S.C. 154(b) by 139 days.

(21) Appl. No.: 10/856,191

(22) Filed: May 28, 2004

(51) Int. Cl.
*G11C 5/14* (2006.01)
(52) U.S. Cl. ..................... 365/229; 365/226
(58) Field of Classification Search .......... 365/229, 365/226, 154; 327/538
See application file for complete search history.

(56) References Cited

U.S. PATENT DOCUMENTS

| | | | |
|---|---|---|---|
| 4,701,778 A | 10/1987 | Aneha et al. | |
| 4,745,084 A | 5/1988 | Rowson et al. | |
| 4,851,892 A | 7/1989 | Anderson et al. | |
| 5,038,192 A | 8/1991 | Bonneau et al. | |
| 5,079,614 A | 1/1992 | Khatakhotan | |
| 5,204,835 A | 4/1993 | Eitan | |
| 5,440,518 A | 8/1995 | Hazani | |
| 5,452,245 A | 9/1995 | Hickman et al. | |
| 5,631,478 A | 5/1997 | Okumura | |
| 5,635,737 A | 6/1997 | Yin | |
| 5,668,752 A | 9/1997 | Hashimoto | |
| 5,687,123 A * | 11/1997 | Hidaka et al. | 365/189.09 |
| 5,691,938 A | 11/1997 | Yiu et al. | |
| 5,723,883 A | 3/1998 | Gheewalla | |
| 5,727,180 A | 3/1998 | Davis et al. | |
| 5,742,099 A | 4/1998 | Debnath et al. | |
| 5,764,566 A * | 6/1998 | Akamatsu et al. | 365/156 |
| 5,861,641 A | 1/1999 | Yoeli et al. | |
| 5,898,194 A | 4/1999 | Gheewala | |
| 5,917,224 A | 6/1999 | Zangara | |
| 5,923,059 A | 7/1999 | Gheewala | |
| 5,923,060 A | 7/1999 | Gheewala | |

(Continued)

OTHER PUBLICATIONS

Brumitt et al., "Low-power SRAMs improve system picture", EE Times, Jan. 22, 2004, pp. 2 total.

(Continued)

*Primary Examiner*—Anh Phung
(74) *Attorney, Agent, or Firm*—Blakely, Sokoloff, Taylor & Zafman LLP

(57) ABSTRACT

Various methods, apparatuses, and systems are described in which a volatile memory that includes a plurality of volatile memory cells as well as a voltage limiting component and a current limiting component. Power consumption in a standby mode is controlled. The voltage limiting component and the current limiting component couple between the volatile memory cells and the ground voltage potential. One or more rows of memory cells in the memory array are isolated from the ground voltage potential to control power consumption in the standby mode by having the current limiting component stop passing current in the standby mode. A floating ground voltage potential sensed by each memory cell when in the standby mode is controlled by configuring the voltage limiting component to conduct when the floating ground voltage potential is larger than a threshold voltage of the voltage limiting component in order to reduce leakage current but reliably maintain the stored contents of the volatile memory cell. The floating ground voltage potential is internally raised higher than a voltage biasing the bulk of the transistors in the volatile memory cells by coupling the floating ground voltage potential to the voltage limiting component.

22 Claims, 6 Drawing Sheets

U.S. PATENT DOCUMENTS

| | | |
|---|---|---|
| 5,926,417 A | 7/1999 | Chang |
| 5,981,987 A | 11/1999 | Brunolli et al. |
| 6,002,607 A | 12/1999 | Dvir |
| 6,069,382 A | 5/2000 | Rahim |
| 6,091,090 A | 7/2000 | Gheewala |
| 6,177,691 B1 | 1/2001 | Iranmanesh et al. |
| 6,242,767 B1 | 6/2001 | How et al. |
| 6,271,542 B1 | 8/2001 | Emma et al. |
| 6,278,148 B1 | 8/2001 | Watanabe et al. |
| 6,307,222 B1 | 10/2001 | Brunolli |
| 6,331,733 B1 | 12/2001 | Or-Bach et al. |
| 6,396,760 B1 | 5/2002 | Behera et al. |
| 6,414,895 B1 | 7/2002 | Kokubo et al. |
| 6,445,049 B1 | 9/2002 | Iranmanesh |
| 6,445,065 B1 | 9/2002 | Gheewala et al. |
| 6,480,432 B1 | 11/2002 | Nakayama |
| 6,519,202 B1 | 2/2003 | Shubat et al. |
| 6,617,621 B1 | 9/2003 | Gheewala et al. |
| 6,646,933 B1 | 11/2003 | Shubat et al. |
| 6,678,202 B1 * | 1/2004 | Scott .......................... 365/229 |
| 6,711,067 B1 | 3/2004 | Kablanian |
| 6,788,574 B1 | 9/2004 | Han et al. |
| 6,838,713 B1 | 1/2005 | Gheewala et al. |
| 6,842,375 B1 | 1/2005 | Raszka |
| 6,850,446 B1 | 2/2005 | Raszka et al. |
| 6,853,572 B1 | 2/2005 | Sabharwal |
| 6,992,938 B1 | 1/2006 | Shubat et al. |
| 7,002,827 B1 | 2/2006 | Sabharwal et al. |

OTHER PUBLICATIONS

Agarwal et al., "A Single-Vt Low-Leakage Gated-Ground Cache for Deep Submicron", IEEE Journal of solid-State Circuits, vol. 38, No. 2, Feb. 2003, pp. 319-328.

* cited by examiner

METHODS AND APPARATUSES FOR MEMORY ARRAY LEAKAGE REDUCTION USING INTERNAL VOLTAGE BIASING CIRCUITRY

FIELD OF THE INVENTION

Embodiments of the invention generally relate to memories. More particularly, an aspect of an embodiment of the invention relates to a volatile memory that reduces leakage current.

BACKGROUND OF THE INVENTION

Wireless and mobile devices depend upon various key requirements, such as minimizing power usage. Power consumption carries the heavy burden of impacting battery life on these portable devices such as cellular phones and PDAs. Maximizing the amount of battery life is very important while being able to maintain performance and minimize cost. Memories consume power even when in a standby mode and are not actively contributing anything to the operation of these portable devices. Also, the percentage of memory elements on a chip is rising. The combination of these two trends suggest that leakage reduction may be required in memory elements when the overall power consumption of the chip is a concern.

Power dissipation in embedded SRAMs fall into two main categories: active power dissipation and standby power dissipation. Active power is described as power consumed during the standard operation of the memory and is typically measured in milliwatts per megahertz (mW/MHz). Standby power dissipation for most CMOS circuits can be due to leakage currents. Assuming the bit lines are precharged to high voltage, these devices have subthreshold leakage from drain to source.

During standby operations bit lines and source lines may be held at the same potential, such as both being in a high voltage state. During an active read operation on a given bit cell, the corresponding source line is, for example, pulled low and word line is turned on. If the particular bit cell being read is programmed as a zero then the bit line discharges through the bit cell's transistor. If the bit cell is programmed as a one, then the bit line should remain high.

Yet, two phenomena may prevent the bit line of a bit cell programmed as a one from staying at a high voltage state during the read operation. Other bit cells that are programmed as zero's and share the same bit line and source line may have sub-threshold leakage current through their existing transistors. The cumulative effect of enough leakage current from these bit cells sharing the same bit line may cause the voltage level of that bit line to decrease to a point where it should be recharged. Also, source line to bit line coupling can cause an adjacent bit line to drop in voltage level.

Some prior art memory arrays can only place an entire memory array rather then portions of the memory array in standby to reduce power consumption. These memories may send a chip select (CS) signal to isolate the entire memory array from a VCC power potential. Also, these memory arrays are not self-biasing to control a floating voltage potential in the isolated memory array because the gate of the limiting component does not sense the magnitude of the floating voltage. Some other prior art memory arrays add additional bias circuits to control the voltage potential of floating voltage potential in the isolated memory array. However, these memory arrays are also not self-biased to control a floating voltage potential in the isolated memory array because the gate of the limiting component does not sense the magnitude of the floating voltage. Rather the limiting component senses the voltage of the biasing circuit. Appropriate regulation of the floating voltage potential can be important. If the floating voltage coupled to a memory cell rises too high, the integrity of the contents stored in the memory cell may be compromised. Use of additional bias circuits may not be desirable because the additional circuits increase the total power consumption of the memory.

SUMMARY OF THE INVENTION

Various methods, apparatuses, and systems are described in which a volatile memory that includes a plurality of volatile memory cells as well as a voltage limiting component and a current limiting component. Power consumption in a standby mode is controlled. The voltage limiting component and the current limiting component couple between the volatile memory cells and the ground voltage potential. One or more rows of memory cells in the memory array are isolated from the ground voltage potential to control power consumption in the standby mode by having the current limiting component stop passing current in the standby mode. A floating ground voltage potential sensed by each memory cell when in the standby mode is controlled by configuring the voltage limiting component to conduct when the floating ground voltage potential is larger than a threshold voltage of the voltage limiting component in order to reduce leakage current but reliably maintain the stored contents of the volatile memory cell. The floating ground voltage potential is internally raised higher than a voltage biasing the bulk of the transistors in the volatile memory cells by coupling the floating ground voltage potential to the voltage-limiting component.

BRIEF DESCRIPTION OF THE DRAWINGS

The drawings refer to embodiments of the invention in which.

Figure 1:
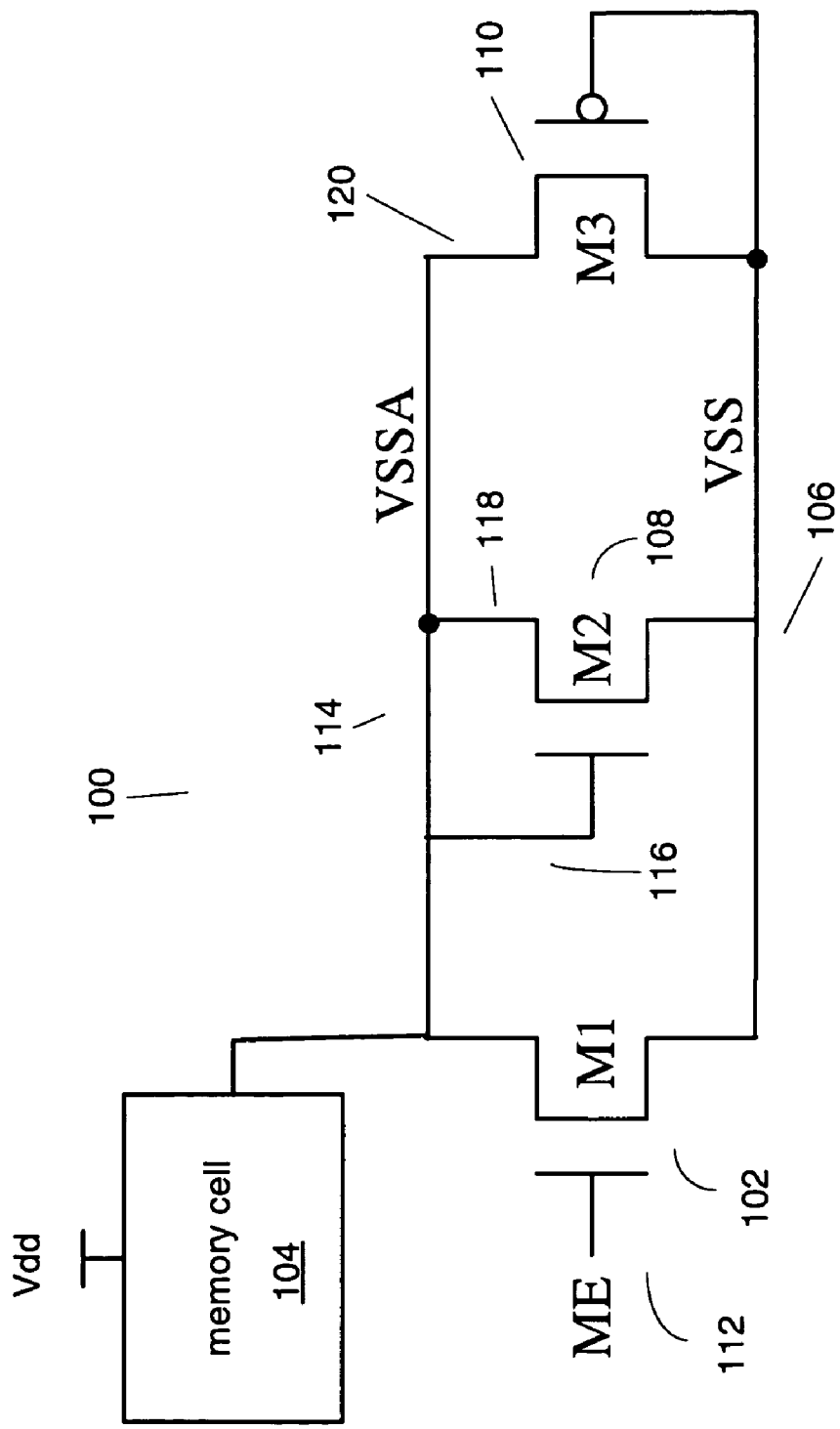
FIG. 1 illustrates a schematic diagram of an embodiment of a leakage current reduction circuit that includes a current limiting component and a pair of voltage limiting components.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set fourth, such as examples of specific data signals, named components, connections, number of memory cells in a memory array, etc., in order to provide a thorough understanding of the present invention. It will be apparent, however, to one of ordinary skill in the art that the present invention may be practiced without these specific details. In other instances, well known components or methods have not been described in detail but rather in a block diagram in order to avoid unnecessarily obscuring the present invention. Further specific numeric references such as first transistor, may be made. However, the specific numeric reference should not be interpreted as a literal sequential order but rather interpreted that the first transistor is different than a second transistor. Thus, the specific details set fourth are merely exemplary. The specific details may be varied from and still be contemplated to be within the spirit and scope of the present invention. The terms bit cell and memory cell may be used interchangeably.

In general, Various methods, apparatuses, and systems are described in which a volatile memory that includes a plurality of volatile memory cells as well as a voltage limiting component and a current limiting component. Power consumption in a standby mode is controlled. The voltage limiting component and the current limiting component couple between the volatile memory cells and the ground voltage potential. One or more rows of memory cells in the memory array are isolated from the ground voltage potential to control power consumption in the standby mode by having the current limiting component stop passing current in the standby mode. A floating ground voltage potential sensed by each memory cell when in the standby mode is controlled by configuring the voltage limiting component to conduct when the floating ground voltage potential is larger than a threshold voltage of the voltage limiting component in order to reduce leakage current but reliably maintain the stored contents of the volatile memory cell. The floating ground voltage potential is internally raised higher than a voltage biasing the bulk of the transistors in the volatile memory cells by coupling the floating ground voltage potential to the voltage-limiting component. The current limiting component and voltage limiting component may be configured to affect the standby power consumption of an entire memory or individual segments of a memory.

FIG. 1 illustrates a schematic diagram of an embodiment of a leakage current reduction circuit that includes a current limiting component and a pair of voltage limiting components. The current limiting component 102, such as a first transistor, couples between a volatile memory cell 104 and a node carrying a VSS ground voltage potential 106. The pair of voltage limiting components 108, 110, such as a second transistor and a third transistor, also couple between the volatile memory cell 104 and the VSS ground voltage potential. A mode signal 112 may be coupled to the gate of the current limiting component 102 to control the operation of the current limiting component 102 when the mode signal 112 indicates that the entire memory array column is in a standby mode, or in other implementations, when a particular row of memory cells in the memory array is being read.

The leakage current reduction circuit 100 controls and reduces power consumption in the memory array when a particular row of memory cells is in standby or even when the entire memory array is in standby. The leakage current reduction circuit 100 isolates one or more rows of memory cells in the memory array from the ground voltage potential to control leakage power consumption in the standby mode by having the current limiting component 102 stop passing current in the standby mode. For example, in the case of standby, the current limiting transistor will stop conducting.

Also, the leakage current reduction circuit 100 controls a node carrying a floating ground voltage potential 114 sensed by each memory cell when in the standby mode by configuring the voltage limiting components 108, 110 to conduct when the floating ground voltage potential is larger than the gate to source threshold voltage of the voltage limiting transistors 108, 110 to reduce leakage current but reliably maintain the stored contents of the volatile memory cell 104. The leakage current reduction circuit 100 generates this raised voltage on the memory array's floating VSS node 114. The leakage current reduction circuit 100 internally raises the floating ground voltage potential higher than a voltage biasing the bulk, which includes a well or substrate, of the transistors in the volatile memory cell 104 by directly coupling the floating ground voltage potential to the voltage limiting components 108, 110. For example, the gate 116 of the first NMOS voltage limiting transistor 108 is self biased by connecting the gate 116 and drain 118 to the node carrying the floating ground voltage potential 114 sensed by the memory cells 104. The source 120 of the PMOS voltage-limiting transistor 110 is self biased by directly connecting to the node carrying the floating ground voltage potential 114 sensed by the memory cells 104.

Figure 2:
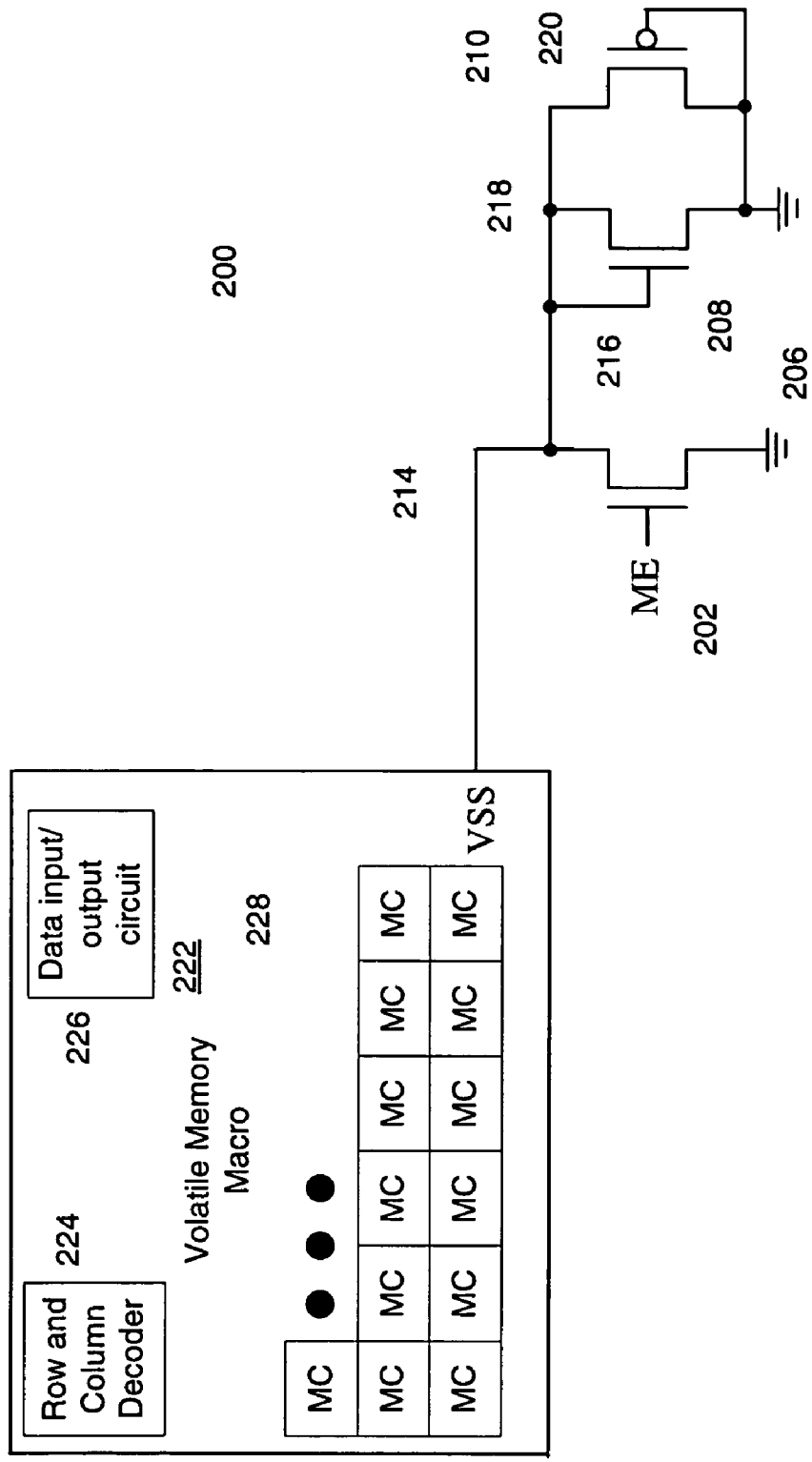
FIG. 2 illustrates a block diagram of an embodiment of memory array connecting to a leakage current reduction circuit.

FIG. 2 illustrates a block diagram of an embodiment of memory array connecting to a leakage current reduction circuit. The memory 222 may contain control circuits, such as decoder circuits 224 and data input/output circuits 226, and multiple rows and columns of volatile memory cells 228. The leakage current reduction circuit 200 may connect to the memory 222 to isolating one or more rows of memory cells 228 in the memory array 222 from a node carrying the VSS ground voltage potential 206 to control leakage power consumption in a standby mode by having a current limiting component 202 stop passing current in the standby mode. The leakage current reduction circuit 200 may connect to the memory 222 to isolate the entire memory 222 including the control circuits from the node carrying the VSS ground voltage potential 206 to control leakage power consumption in a standby.

The gate of the current limiting transistor 202 couples to a memory enable line 212. The mode signal from the memory enable line 212 controls the operation of the current limiting component 202 and is de-asserted when the entire memory 222 is in stand by mode.

The leakage current reduction circuit 200 may also connect to the memory 222 to control a node carrying a floating ground voltage potential 214 sensed by each pull down transistor in the memory cells when in the standby mode by configuring the voltage limiting components 208, 210 to conduct when the floating ground voltage potential is larger than the threshold voltage of the voltage limiting components to reduce leakage current.

The voltage limiting components 208, 210 may be a pair of transistors configured to electrically behave like diodes. As described above, when the floating ground voltage increases that voltage increase is directly sensed on the gate 216 and drain 218 of the first NMOS transistor 208 and the source 220 of the second PMOS transistor 220.

In an embodiment, in normal operation, the ME (Memory enable) signal 112 is raised to logic 1, i.e. the VDD voltage potential. This will pull the floating ground VSSA node 214 voltages down to the VSS potential by making the first current limiting transistor 202 conduct. The memory 222 behaves as it normally would in this mode. In the low-leakage mode, the ME signal 112 is set to logic 0, i.e. the VSS potential. At this point, there is no conducting path from the floating ground potential to the VSS potential. The first current limiting transistor 202 is cutoff. Charge accumulates on the floating ground VSSA node 214 due to leakage currents from transistors in the memory cells 228. Due to the increase in charge on the floating ground node 214, the voltage potential of the floating ground node 214 slowly rises. Once the floating ground voltage potential is larger than either of the first voltage limiting transistor's 208 threshold voltage or the second voltage limiting transistor's 210 threshold voltage, those transistors 208, 210 will begin to conduct, and will in turn, prevent the floating ground voltage from rising. The floating ground voltage will be held in steady-state at a voltage potential approximately equal to the gate to source threshold voltages of the clamping transistors 208, 210 above the VSS potential. Both an NFET transistor 208 and PFET transistor 210 may be used in the voltage clamping circuit to help compensate for manufacturing variations. While the floating ground voltage is raised above VSS, the memory 222 may possibly not be safely operated. Therefore, all word lines (WL0..n) should be held low. Activating the word lines may cause excess coupling onto the node carrying the floating ground voltage, raising the voltage too high to safely preserve the contents of the SRAM volatile memory 222.

The leakage current reduction circuit 200 allows for customers to have a low-power/low-leakage memory solution without forcing these customers to have any extra controlling circuitry to operate the memory.

Figure 3:
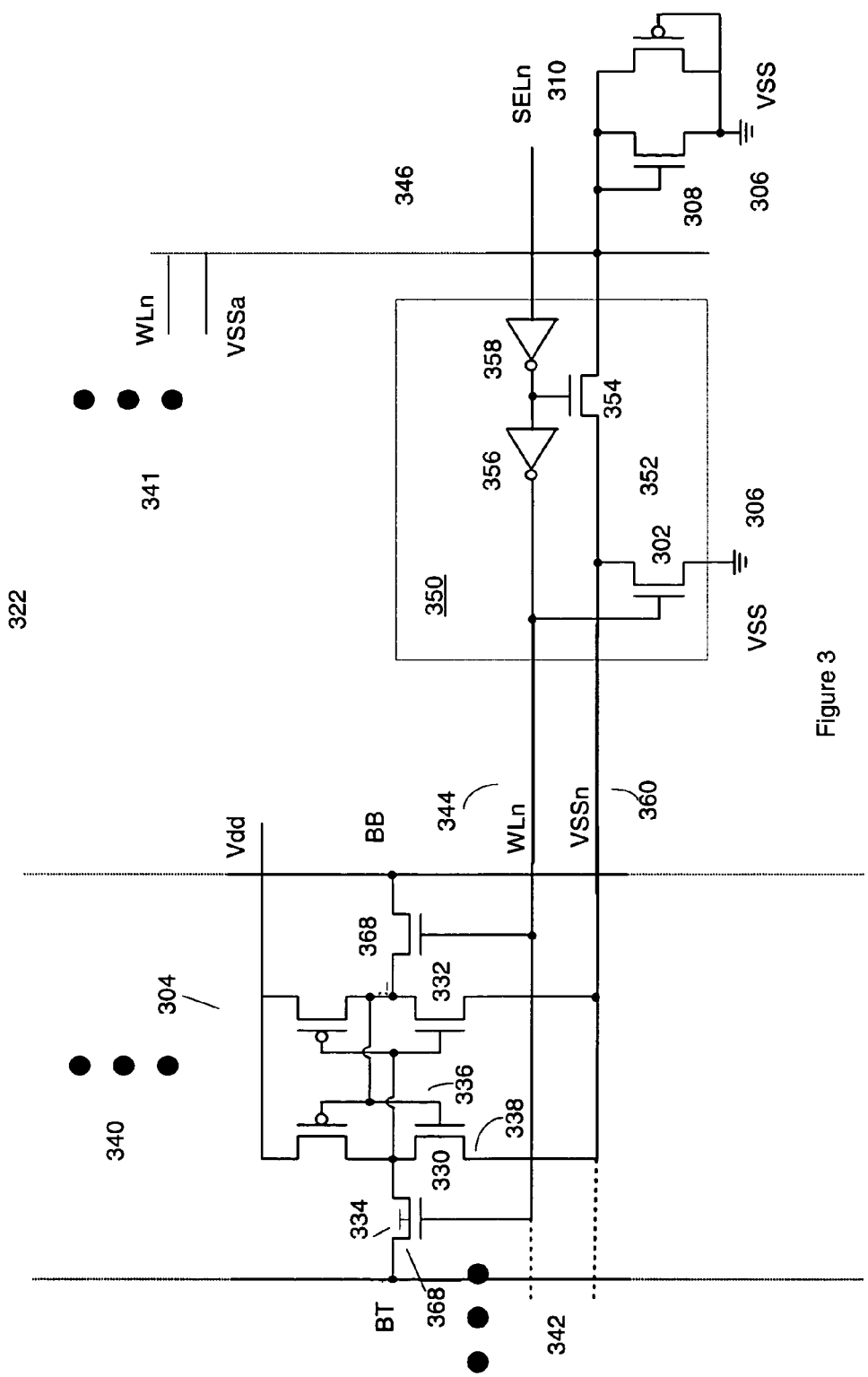
FIG. 3 illustrates a schematic diagram of an embodiment of leakage current reduction and isolation circuit connecting to each row of memory cells in a volatile memory array.

FIG. 3 illustrates a schematic diagram of an embodiment of leakage current reduction and isolation circuit connecting to each row of memory cells in a volatile memory array. The memory array 322 may have rows and columns of volatile bit cells having pull down transistors. For example, a first volatile bit cell 304 may have a first pull down transistor 330 and a second pull down transistor 334. Each of the transistors in the memory cell has a drain, a source and a gate. For example, a first pull down transistor 330 has a drain 334, a source 338, and a gate 336. The dots 340 above the first volatile bit cell 304 indicate that the bit cell is tiled/replicated above the bit cell to form a column of bit cells. The dots 342 horizontal to the first volatile bit cell 304 indicate that the bit cell is tiled/replicated horizontally to the bit cell to form a row of bit cells. A word line, such as a first word line 344 connects to portions of or the entire row of bit cells. A global floating ground electrical pathway 346 connects to the pull down transistors of each volatile bit cell. The floating ground voltage potential node 346 may be defined as the node coupled to the source terminals of the pull down transistors in the volatile memory cells.

The first current limiting transistor 302 couples to the first word line 344. The first word line 344 may be asserted when that word line is selected for a read and/or write operation and that asserted signal may control the operation of the first current limiting transistor 302. The leakage current reduction and isolation circuit 350 helps to preserve the contents of the memory cells when the word line is activated. The leakage current reduction and isolation circuit 350 may consist of the first current limiting transistor 302 and an isolation component, such as a fourth transistor 354 coupled to a pair of inverters 356, 358. The dots 341 above the first leakage current reduction and isolation circuit 350 indicate that the circuit is tiled/replicated above the circuit and individually connected to the end of a row of bit cells. The leakage current reduction and isolation circuit 350 may isolate the first segment 360 of the electrical path carrying the floating ground voltage from the remainder of the electrical path carrying a global floating ground voltage 346 that couples to each row of memory cells when the first word line 344 is asserted. Thus, the fourth transistor cuts off isolating the first segment 360 of the electrical path carrying the floating ground voltage from the global node 346 carrying the floating ground voltage.

The current limiting component 302 and the voltage limiting components 308, 310 couple between the sources 338, 362 of the pull down devices 330, 332 in the memory cell and the ground node (VSS) 306 of the circuit. This set of devices 302, 308, 310 connected in parallel provides a way to reduce the leakage current through the bit cell while maintaining the safely contents of the memory cell. If the floating ground node 346 coupled to the sources of the pull down devices rises too high in voltage potential, the integrity of the contents of the bit cells connected to that node may be compromised. The current limiting component 302 pulls the floating ground voltage down to the ground voltage (VSS) when that particular row of memory cells is active. When that particular row of memory cells is inactive, the controlling signal can be set to disconnect floating ground node 346, 360 from VSS node 306, thus allowing the floating ground voltage to rise due to charge leaking onto the node from the bit cells. The voltage limiting components 308, 310, such as a diode connected transistor configuration, may be used because the non-linear impedance provides an effective upper limit on the floating ground voltage. Both an NFET and PFET device may be used to reduce the output range of the floating ground voltage due to normal processing deviations.

The leakage current reduction technique back-biases the source to bulk voltage of transistors in the SRAM memory. For example, the NFET transistors 330, 332, 364, and 368 in the first bit cell 304 may have its bulk, i.e. substrate or well, biased by a voltage other than VSS or VDD. The fifth transistor 364 will have some voltage potential on its bulk 370. Even without the additional bias voltage source, some voltage potential will exist on the bulk of each transistor in the bit cell. The leakage reduction technique relates to subthreshold leakage current reduction in the NFET devices in the memory bit cell. The leakage current reduction is achieved by internally raising the memory arrays floating VSS voltage higher than the voltage potential sensed on the bulk of the transistors. The bulk voltage may be defined to be the node connected to the bulk of the NFET devices in the memory cell. Therefore, the floating ground voltage is raised to approximately a threshold of the voltage limiting components 308, 310 above the bulk voltage potential. The circuitry 308, 310 generates the bias voltage for the leakage reduction, along with the circuitry 350 used to switch into and out of the low-leakage mode.

The leakage circuit reduces the overall power consumption of SRAM memory elements on a chip due to leakage currents in the bit cells. The leakage circuit is able to able to provide a significant power reduction while the memory is inactive or active.

In normal operation, charge will accumulate on the floating ground node 346 due to leakage currents from the memory arrays pull down transistors, such as the first and the second pull down transistors 330, 332, and through the fifth transistor 354. Due to the increase in charge on the floating ground, the voltage of the node 346 will slowly rise. Once the floating ground voltage is larger than either the first voltage limiting transistor's 308 threshold voltage or the second voltage limiting transistor's 310 threshold voltage, those transistors will begin to conduct, and will in turn, prevent the voltage from rising. The floating ground voltage will be held in steady-state at a voltage approximately equal to the gate to source threshold voltages of the clamping transistors 308, 310.

While the floating ground voltage is raised above VSS potential, portions of the memory may not be reliably operated. Therefore, when a word line, such as the first word line 344, is selected (by raising SELn), the invertors 356, 358 and the fifth transistor 354 may be used to disconnect the row of memory cells local floating ground node 360 from the global VSSA node 346. The invertors 356, 358 and the first current limiting transistor 302 also enable a conducting path to the VSS node 306. The information stored in that row of memory cells may now be reliably operated upon. The inactive rows local floating ground node still continue to be connected to the global floating voltage node 346 through their transistor similar to the fifth isolation transistor 354. The inactive rows of memory cells local floating ground nodes still are raised higher than the VSS voltage. Also, the inactive rows will continue to charge up the global floating ground voltage node causing the voltage to rise, thus reduce leakage current in the inactive rows of memory cells. Thus, the inactive rows of memory cells will continue to be leaking a smaller amount current due to the back biasing effect. When the first word line 344 is deactivated, the local floating ground node 360 reconnects to the global floating voltage node 346 and the local current limiting transistor 302 disconnects the VSS node 306.

Accordingly, a separate isolation circuit 350 consisting of invertors, current limiting transistors and isolation transistors connects to each row of memory cells. The isolation circuit holds back the global floating ground voltage when a row of memory cells is activated for a read and/or write operation. The other inactive rows of memory cells will continue to be coupled to the global floating ground voltage, while the active row of memory cell will be coupled directly to VSS via the local current limiting component.

Figure 4A:
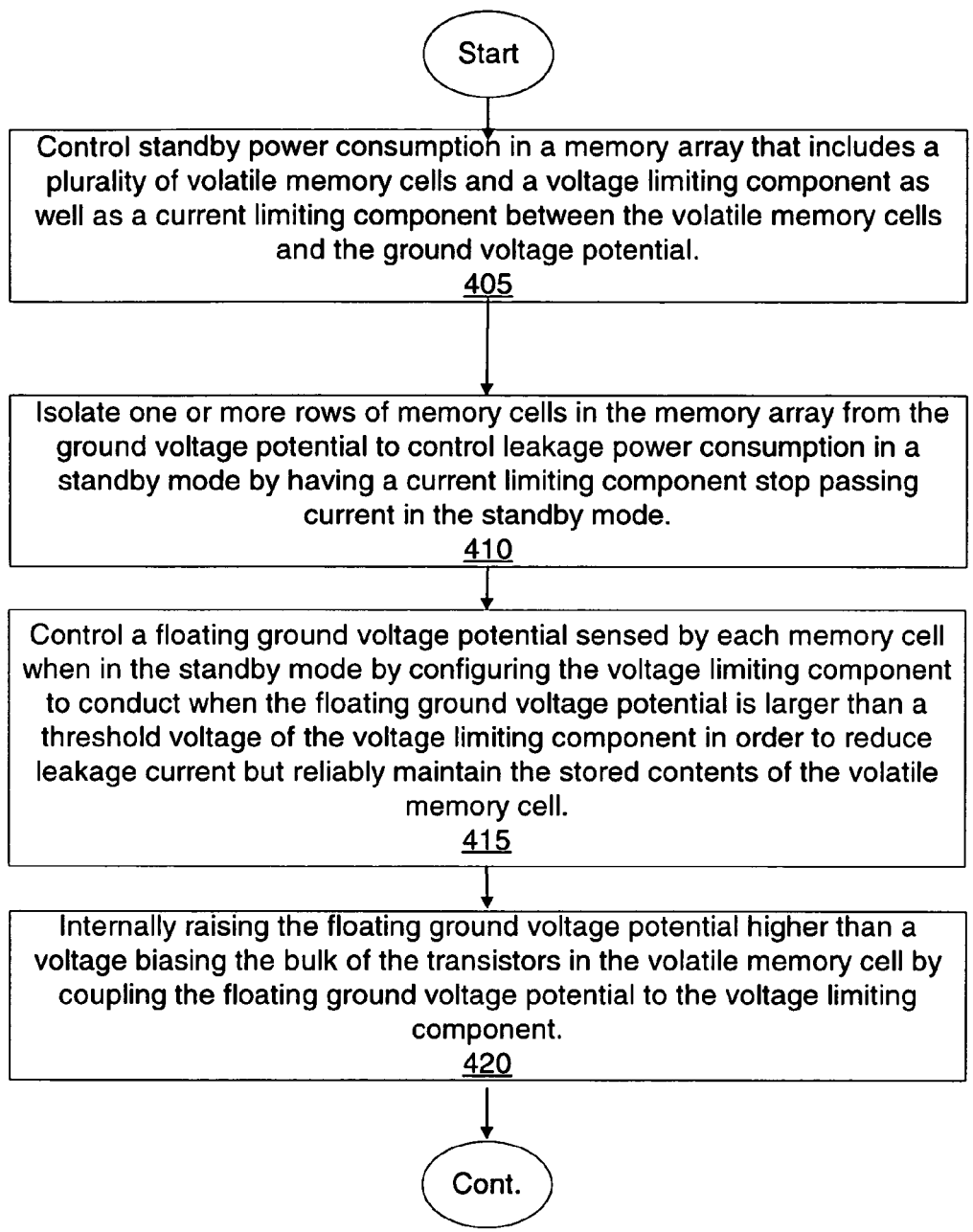
FIGS. 4a and 4b illustrate a flow diagram of an embodiment a volatile memory array that controls standby power consumption with a voltage limiting component and a current limiting component.
Figure 4B:
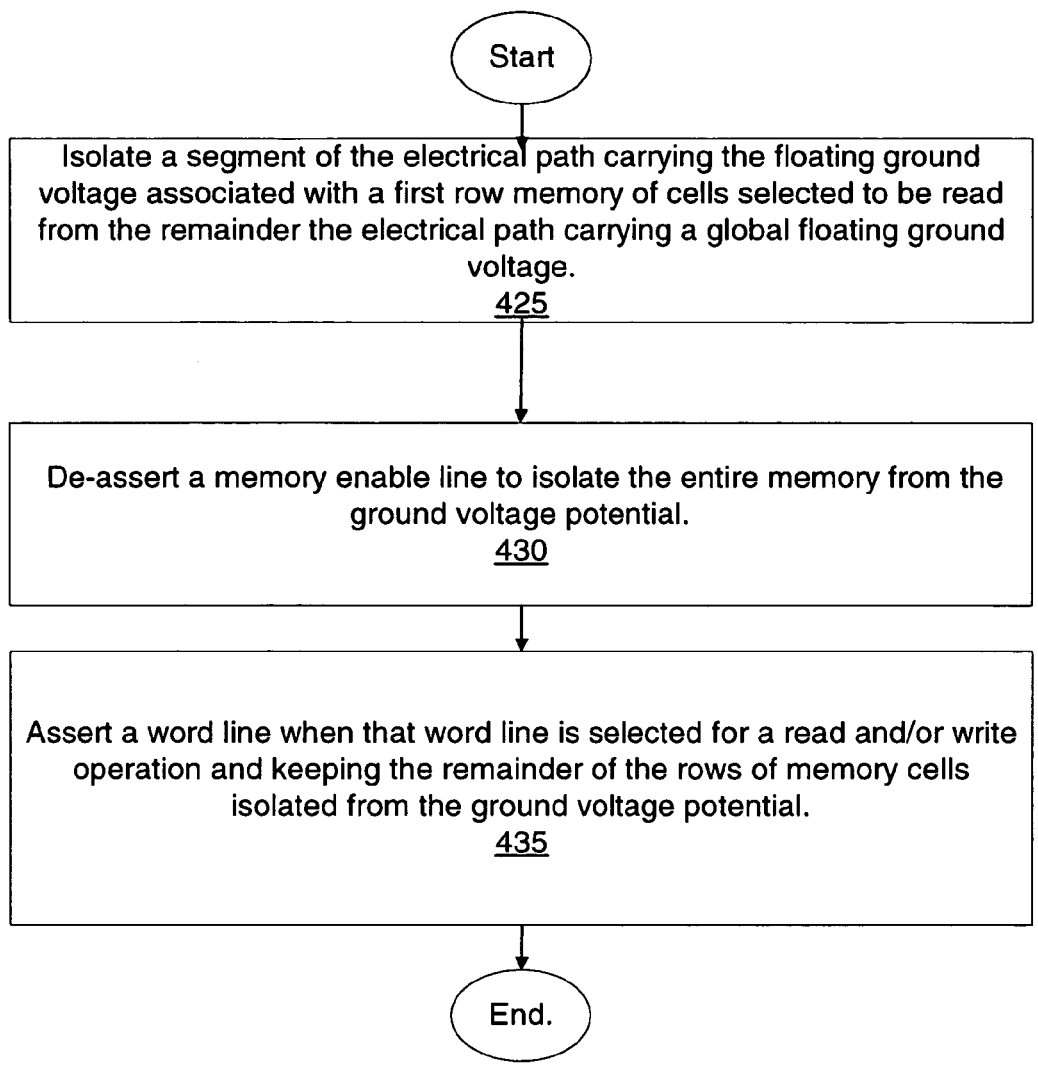

FIGS. 4a and 4b illustrate a flow diagram of an embodiment a volatile memory array that controls standby power consumption with a voltage limiting component and a current limiting component.

In block 405, the memory controls standby power consumption in a memory array that includes a plurality of volatile memory cells and a voltage limiting component as well as a current limiting component between the volatile memory cells and the ground voltage potential.

In block 410, the memory isolates one or more rows of memory cells in the memory array from the ground voltage potential to control leakage power consumption in a standby mode by having a current limiting component stop passing current in the standby mode.

In block 415, the memory controls a floating ground voltage potential sensed by each memory cell when in the standby mode by configuring the voltage limiting component to conduct when the floating ground voltage potential is larger than a threshold voltage of the voltage limiting component in order to reduce leakage current but reliably maintain the stored contents of the volatile memory cell. This method safely restricts the maximum voltage for VSSA.

In block 420, the memory internally raises the floating ground voltage potential higher than a voltage biasing the bulk of the transistors in the volatile memory cell by coupling the floating ground voltage potential to the voltage limiting component.

In block 425, the memory isolates a segment of the electrical path carrying the floating ground voltage associated with a first row memory of cells selected to be read from the remainder of the electrical path carrying a global floating ground voltage. Thus, The floating gate biasing voltage can be generated when the memory is in an active or inactive mode because only s a small segment of the electrical pathway carrying the floating gate voltage needs to be pulled down to the actual VSS voltage potential.

In block 430, the memory de-asserts a memory enable line to isolate the entire memory from the ground voltage potential.

In block 430, the memory asserts a word line when that word line is selected for a read and/or write operation and keeping the remainder of the rows of memory cells isolated from the ground voltage potential.

Figure 5:
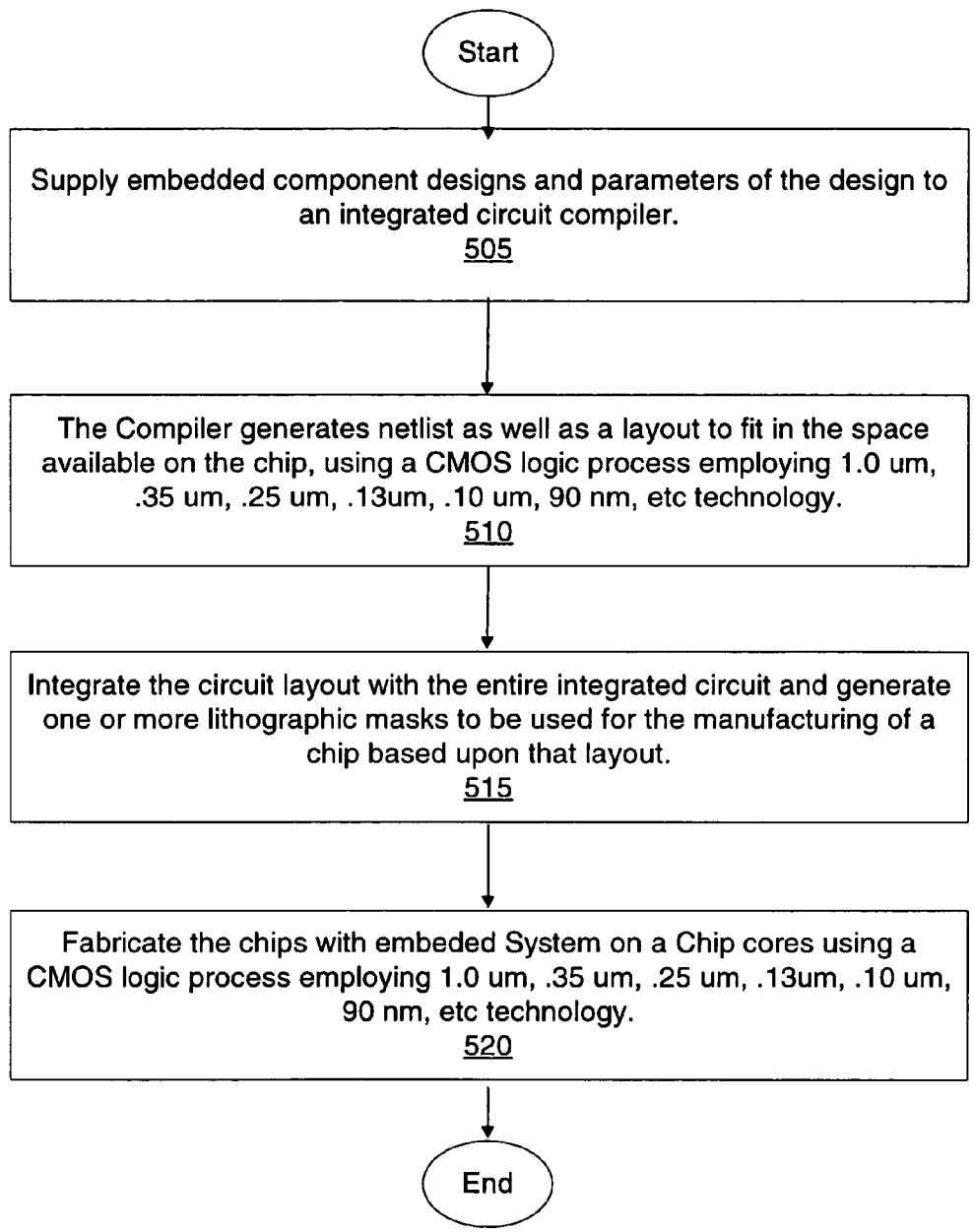
FIG. 5 illustrates an example process of generating an embedded memory from designs of memory components with an embodiment of a memory compiler.

FIG. 5 illustrates an example process of generating an embedded memory from designs of memory components with an embodiment of a memory compiler.

In block 505, the designs for each memory component for the embedded memory are supplied to the memory compiler, as well as other design parameters such as the number of columns and number of rows of the array, the available size on the chip and other parameters. Thus, the designs for one or more volatile memory arrays having reduced leakage current may be supplied to the memory compiler. A memory compiler may be a software program comprised of multiple algorithms and designs for the purpose of generating a circuit design and a layout in a space available on a target chip. The set of application-specific algorithms and interfaces of the memory compiler may be used by system IC integrators to rapidly create hundreds of silicon-proven memory cores. The memory compiler receives the memory component designs and utilizes those memory component designs in conjunction with memory circuit designs to optimize a circuit design and layout in the space available on a target chip.

In block 510, the memory compiler generates a netlist and a layout targeted to fit in the space available on a target chip. The memory compiler stores the data representing the embedded memory typically on a machine-readable medium. The memory compiler selects the memory component building blocks so that they are sized appropriate for the targeted fabrication technology. The memory compiler then provides the memory layout to be used to generate one or more lithographic masks to be used in the fabrication of that embedded memory. The memory compiler also provides a netlist for verification of the embedded memory.

In block 515, the memory layout generated is integrated with the rest of the layout for the chip and a machine generates the lithographic masks that contain the information necessary for the fabrication of a functional device. The machine generates one or more lithographic masks to be used to transfer that circuit design onto the chip. The ultra low power SRAM memory solution for embedded applications may integrate with the standard single poly CMOS processes.

In block 520, a fabrication facility fabricates the chips with the embedded memories using the lithographic masks generated from the memory compiler's circuit design and layout. Fabrication facilities may use a standard CMOS logic process having minimum line widths such as 1.0 um, 0.50 um, 0.35 um, 0.25 um, 0.18 um, 0.13 um, 0.10 um, 90 nm, or less, to fabricate the chips. The size of the CMOS logic process employed typically defines the smallest minimum lithographic dimension that can be fabricated on the chip using the lithographic masks, which in turn determines minimum component size. In an embodiment, light is shown through these lithographic masks onto the chip to transfer the circuit design and layout for the embedded memory onto the chip itself. In an embodiment, the volatile memory cell compiler is designed for embedded applications in the standard CMOS logic process.

In an embodiment, the chip may be programmed in the back end of the fabrication process using a layer physically higher than the diffusion layer. The memory compiler may generate instances that may be programmed by a programming tool. The Compiler uses routing and cell architecture that allows designers to create custom designs with just a few metal layers and via masks. The via layer and/or metal layer programmed cells may be completed in the back-end of the manufacturing process. If the programming of the memory isn't made until later or a revision is needed, then the designer merely has to redesign the block, a few metal and via masks, thereby preserving all of the other masks.

In one embodiment, the software used to facilitate the memory compiler can be embodied onto a machine-readable medium. A machine-readable medium includes any mechanism that provides (e.g., stores and/or transmits) information in a form readable by a machine (e.g., a computer). For example, a machine-readable medium includes read only memory (ROM); random access memory (RAM); magnetic disk storage media; optical storage media; flash memory devices; DVD's, electrical, optical, acoustical or other form of propagated signals (e.g., carrier waves, infrared signals, digital signals, EPROMs, EEPROMs, FLASH, magnetic or optical cards, or any type of media suitable for storing electronic instructions. Slower mediums could be cached to a faster, more practical, medium.

In an embodiment, an example memory compiler may comprise the following. A graphic user interface, a common set of processing elements, and a library of files containing design elements such as circuits, control logic, and cell arrays that define the complier. In an embodiment, object code in a set of executable software programs.

As noted, in an embodiment, a designer chooses the specifics of the memory configuration to produce a set of files defining the requested memory instances. A memory instance may include front end views and back end files. The front end views support documentation, simulation, debugging, and testing. The back end files, such as a layout, physical LEF, etc are for layout and fabrication.

The memory complier outputs may include Behavioral Models and Test Benches (Verilog, VHDL), •Timing Models (TLF, .Lib and STAMP), Test Models (MemBIST, FastScan), Structural Netlists (EDIF, Spice), Power Models (WattWatcher, ALF), Floorplanning and Place&Route Models, Physical LEF, FRAM, Layout (GDS), Datasheets (including power, timing, and area specifications, as well as other outputs. When programming occurs or if a revision is needed, the designer merely has to redesign the block, a few metal and via masks.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers, or other such information storage, transmission or display devices.

While some specific embodiments of the invention have been shown the invention is not to be limited to these embodiments. For example, the voltage used with the components may be reversed. The voltage limiting component may be a transistor or similar component. The current limiting component may be a transistor or similar component. The invention is to be understood as not limited by the specific embodiments described herein, but only by scope of the appended claims.

We claim:

1. A method, comprising:
   controlling standby power consumption in a memory array that includes a plurality of volatile memory cells as well as a voltage limiting component and a current limiting component between the volatile memory cells and a ground voltage potential;
   isolating one or more rows of memory cells in the memory array from the ground voltage potential to control power consumption in a standby mode by having the current limiting component stop passing current in the standby mode;
   controlling a floating ground voltage potential sensed by each memory cell when in the standby mode by configuring the voltage limiting component to conduct when the floating ground voltage potential is larger than a threshold voltage of the voltage limiting component in order to reduce leakage current but reliably maintain stored contents of the volatile memory cells; and
   internally raising the floating ground voltage potential higher than a voltage biasing the bulk of the transistors in a volatile memory cell by coupling the floating ground voltage potential to the voltage limiting component.

2. The method of claim 1, further comprising:
   isolating a segment of the electrical path carrying the floating ground voltage associated with a row memory of cells selected to be read from the remainder of the electrical path carrying a global floating ground voltage.

3. The method of claim 1, wherein a current limiting component and an isolation component isolate a first segment of the electrical path carrying the floating ground voltage from the remainder of the electrical path carrying a global floating ground voltage couples to each row of memory cells.

4. The method of claim 1, wherein the current limiting component and the voltage limiting component couple to the entire array of volatile memory cells.

5. The method of claim 1, wherein the gate of the voltage limiting component is biased by connecting to the floating ground voltage potential sensed by the memory cells.

6. The method of claim 1, wherein the current limiting component couples to a memory enable line that is de-asserted when the entire memory is in stand by mode.

7. The method of claim 1, wherein the current limiting component couples to a word line and is asserted when that word line is selected for a read and/or write operation.

8. The method of claim 1, wherein each volatile memory cell has pull down transistors with a drain, a source, and a gate and the ground voltage potential node is defined to be the node coupled to the source terminals of the pull down transistors in the volatile memory cells.

9. The method of claim 1, wherein the bulk voltage node is the node connected to the bulk of the NFET devices in the memory cell.

10. The method of claim 1, wherein the voltage limiting component is a pair of transistors configured to electrically behave like diodes.

11. The method of claim 1, further comprising:
asserting a mode signal to the current limiting component to control the operation of the current limiting component.

12. A machine readable medium that stores instructions, which when executed by the machines, to cause the machine to perform the method of claim 1.

13. The machine readable medium of claim 12, wherein the machine readable medium comprises a memory compiler to provide a layout utilized to generate one or more lithographic masks used in the fabrication of the volatile memory.

14. An apparatus, comprising:
means for controlling standby power consumption in a memory array that includes a plurality of volatile memory cells as well as a voltage limiting component and a current limiting component between the volatile memory cells and a ground voltage potential;
means for isolating one or more rows of memory cells in the memory array from the ground voltage potential to control power consumption in a standby mode by having the current limiting component stop passing current in the standby mode;
means for controlling a floating ground voltage potential sensed by each memory cell when in the standby mode by configuring the voltage limiting component to conduct when the floating ground voltage potential is larger than a threshold voltage of the voltage limiting component in order to reduce leakage current but reliably maintain stored contents of the volatile memory cells; and
means for internally raising the floating ground voltage potential higher than a voltage biasing the bulk of the transistors in a volatile memory cell by coupling the floating ground voltage potential to the voltage limiting component.

15. The apparatus of claim 14, further comprising:
means for isolating a segment of the electrical path carrying the floating ground voltage associated with a row memory of cells selected to be read from the remainder of the electrical path carrying a global floating ground voltage.

16. The apparatus of claim 14, wherein a current limiting component and an isolation component isolate a segment of the electrical path carrying the floating ground voltage from the remainder of the electrical path carrying a global floating ground voltage couples to each row of memory cells.

17. A machine readable medium that stores data and instructions that represents the apparatus fo claim 14, which when executed to cause the machine to generate a representation of the apparatus of claim 14.

18. The machine readable medium of claim 17, wherein the machine readable medium comprises a memory compiler to provide a layout utilized to generate one or more lithographic masks used in the fabrication of the volatile memory.

19. The apparatus of claim 13, wherein the current limiting component couples to a word line and is asserted when that word line is selected for at least one of read or write operation.

20. An apparatus, comprising:
A volatile memory that includes a plurality of volatile memory cells as well as a voltage limiting component and a current limiting component, wherein the voltage limiting component and the current limiting component couple between the volatile memory cells and the ground voltage potential to control power consumption in a standby mode;
an enable signal coupled to the current limiting component to isolate one or more rows of memory cells in the memory array from the ground voltage potential to control power consumption in the standby mode by having the current limiting component stop passing current in the standby mode; and
a node carrying a floating ground voltage potential sensed by each memory cell when in the standby mode connects directly to the voltage limiting component, wherein the node carrying floating ground voltage potential is controlled by configuring the voltage limiting component to conduct when the floating ground voltage potential is larger than a threshold voltage of the voltage limiting component in order to reduce leakage current but reliably maintain the stored contents of the volatile memory cell.

21. The apparatus of claim 20, wherein the voltage limiting component includes a transistor and the node carrying the floating ground voltage potential connects to the gate of the transistor.

22. A machine readable medium that stores data and instructions that represents the apparatus of claim 20, which when executed to cause the machine to generate a representation of the apparatus of claim 20.

* * * * *